United States Patent [19]

Mueck

[11] Patent Number: 5,977,825
[45] Date of Patent: Nov. 2, 1999

[54] ELECTRONIC CIRCUIT FOR LINEARIZATION OF AN AMPLIFIER

[75] Inventor: Karl Mueck, Sulzbach An Der Nurr, Germany

[73] Assignee: Robert Bosch GmbH, Stuttgart, Germany

[21] Appl. No.: 08/982,788

[22] Filed: Dec. 2, 1997

[30] Foreign Application Priority Data

Dec. 12, 1996 [DE] Germany .......................... 196 50 388

[51] Int. Cl.⁶ .................................................. H03F 1/00
[52] U.S. Cl. .......................................... 330/151; 330/149
[58] Field of Search ................................... 330/151, 149, 330/52; 375/297

[56] References Cited

U.S. PATENT DOCUMENTS

| 5,077,532 | 12/1991 | Obermann et al. |        |
|-----------|---------|-----------------|--------|
| 5,532,642 | 7/1996  | Takai.          |        |
| 5,565,814 | 10/1996 | Fukuchi         | 330/52 |
| 5,770,971 | 6/1998  | McNicol         | 330/52 |

FOREIGN PATENT DOCUMENTS

| 0 411 180 A1 | 2/1991  | European Pat. Off. |
| 0 466 123 A1 | 1/1992  | European Pat. Off. |
| 0 630 101 A2 | 12/1994 | European Pat. Off. |
| WO 94/17587  | 8/1994  | WIPO. |

OTHER PUBLICATIONS

"Reduction of Noise and Distortion in Amplifiers Using Adaptive Cancellation", Ashok, K. Talwar, IEEE Transactions on Microwave Theory and Techniques, vol. 42, No. 6, Jun. 1994, pp. 1086–1087.
"Multilevel QAM Digital Radio", Yoshiaki Suzuki, et al, 2311 Fujitsu Scientific & Technical Journal 22 (1986) Autumn, No. 4, Kawasaki, Japan, pp. 294–306.
"A Highly–Efficient Linear Amplifier for Satellite and Cellular Application", K.J. Parsons, et al, 1995 IEEE, pp. 203–207.
Patent Abstract of Japan, 57037909, Mar. 2, 1982, Sato Gunkicki: "Wiper Blade Electric Power Amplifier".

*Primary Examiner*—Robert Pascal
*Assistant Examiner*—Henry Choe
*Attorney, Agent, or Firm*—Michael J. Striker

[57] ABSTRACT

In order to provide a feed-forward amplifier with an error signal amplifier (V3) which only requires a reduced linear modulation range and thus is more economical, a pre-distortion device (VVZ) is connected electrically to the amplifier (V1) and a control unit (ST1) is provided which adjusts the pre-distortion device (VVZ) during operation of the amplifier (V1) in a nonlinear modulation range according to an error signal (f1) so that the error signal (f1) which is fed to the error signal amplifier (V3) is minimized.

9 Claims, 4 Drawing Sheets

ELECTRONIC CIRCUIT FOR LINEARIZATION OF AN AMPLIFIER

BACKGROUND OF THE INVENTION

The present invention relates to an electronic circuit for linearization of an amplifier, which has a error signal amplifier, which amplifiers an error signal derived from the input and output signal of the amplifies, which is superimposed on the output signal for compensation of the intermodulation products contained in it.

This type of amplifier, which is designated in the literature as a feed-forward-amplifier, is, for example described in IEEE Transactions on Microwave Theory and Techniques, Vol. 2, No. 6, June 1994, pp. 1086 to 1087.

There are very strict requirements for the linearity of a transmitting amplifier for example for the QAM modulation type used for digital radio broadcasting. The higher the number of modulation stages (16, 64, 128, 256, 512 QAM), the higher are the linearity requirements for the amplifier. The transmission power also increases for the higher modulation stages 256 and 512 QAM, so that a greater signal/noise ratio is obtained at the same radio field strength.

It is desirable to use as few amplifier stages as possible. Thus one tries to modulate each amplifier as much as possible, that is to bring the peak modulation in the vicinity of 1 dB-compression point. Thus the amplifier is not only operated in its linear, but also in its nonlinear, region. In order in spite of that to obtain a sufficiently large intermodulation spacing in the output signal of the amplifier, the above-mentioned linearization of the amplifier is performed. The error signal amplifier used in the feed-forward-amplifiers may of course only be operated in its linear control range so that it does not still produce additional intermodulation products. However a comparatively greater linear modulation range is then required from these error signal amplifiers, particularly when these error signals are large. An error signal amplifier with a comparatively large linear modulation range, i.e. also with a high 1 dB-compression point, is difficult to make so that it is comparatively expensive. This type of error amplifier produces a comparatively high power loss.

SUMMARY OF THE INVENTION

It is an object of the present invention to provide an electronic circuit for linearization of an amplifier of the above-described type, which is sufficient for its purpose but is as inexpensive and easy to construct as possible.

According to the invention the electronic circuit for linearization of an amplifier comprises means for deriving an error signal from the input and output signal of the amplifier, an error signal amplifier including means for amplifying the error signal, means for superimposing the error signal on the output signal to compensate for the intermodulation products contained in the output signal, and especially a pre-distortion device connected to the amplifier to reduce the required linear modulation range of the amplifier used to amplify the error signal and a first control unit including means for adjusting the pre-distortion device during operation of the amplifier in a nonlinear modulation region according to the error signal to minimize the error signal.

Because of these features the circuit according to the invention attains the above-described object. A pre-distortion device is connected to the amplifier and a control device is provided, which adjusts the pre-distortion device in operation of the amplifier in a non-linear modulation range according to the error signal so that the error signal is minimized. The smaller the error signal is, the smaller is the modulation range required of the error signal amplifiers. An error signal amplifier with a comparatively smaller linear modulation range can then be used with reduced circuit expense.

Various embodiments of the electronic circuit of the invention are possible. Thus the control unit can adjust the magnitude and phase of a first signal component decoupled from the input signal according to the difference between the output and the input signal components of the amplifier in operation of the amplifier in the linear modulation range so that the information containing signal components in the difference signal between the output and the input signal component are as small as possible.

The above-mentioned control unit or also a second control unit separate from it adjusts the magnitude and the phase of the error signal so that by superposition of the error signal with the output signal of the amplifier as great as possible a compensation of the intermodulation products can occur in the output signal. The second control unit preferably adjusts the magnitude and the phase of the error signal according to a difference between another signal component decoupled from the input signal and a signal component decoupled from the resulting error-compensated output signal. The second control unit preferably adjusts the magnitude and phase of the signal component decoupled from the error-compensated output signal so that the information-containing signal is reduced in the difference signal. A mixer is provided which mixes the difference signal at an intervening frequency level and the resulting mixed signal is then fed to the second control unit via a spectrum detector for selection of spectral components on both sides of the information-containing signal spectrum.

BRIEF DESCRIPTION OF THE DRAWING

The object, features and advantages of the present invention will now be illustrated further in the following description of the preferred embodiments with reference to the accompanying drawing in which.

DESCRIPTION OF THE PREFERRED EMBODIMENTS

Figure 1:
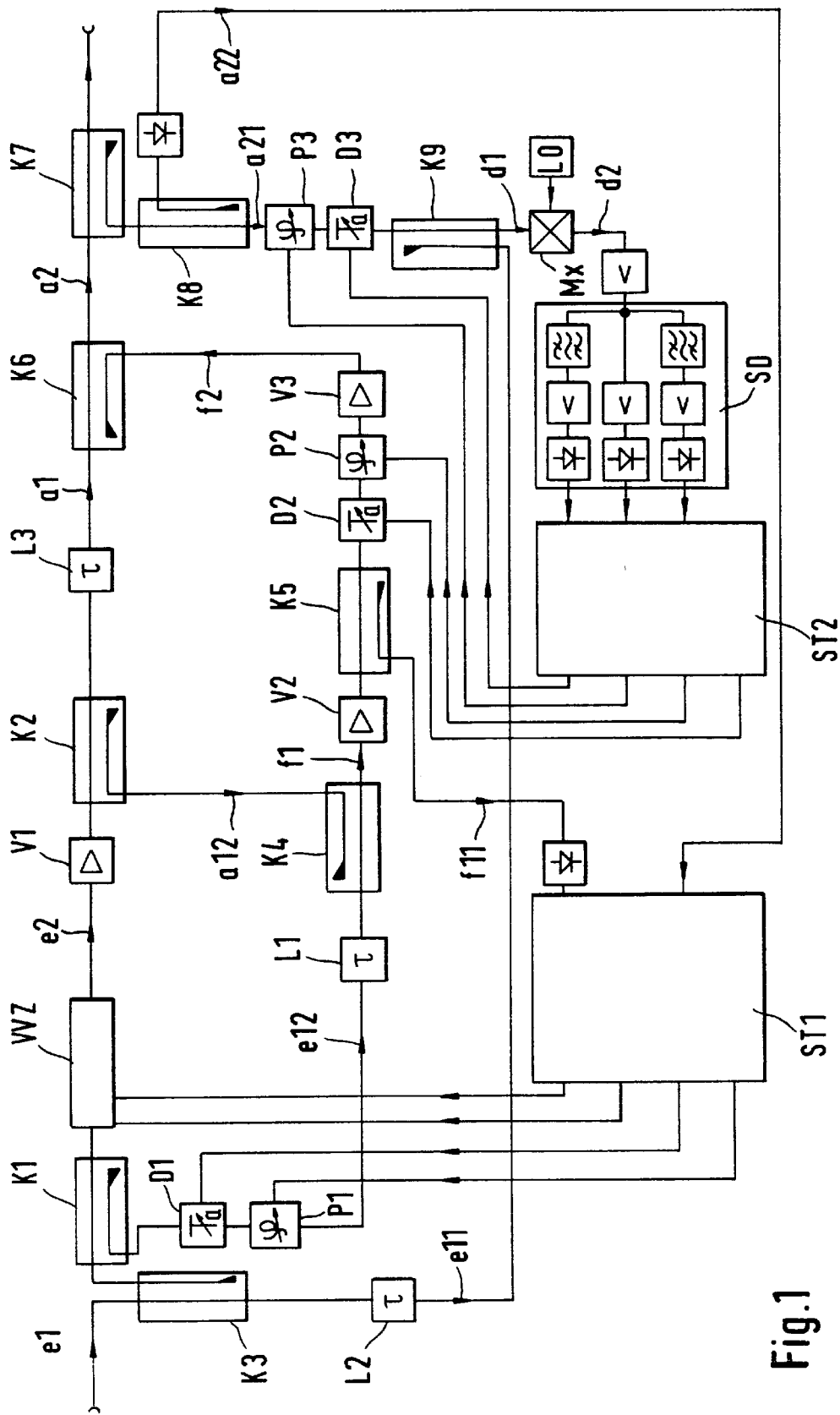
FIG. 1 is a schematic diagram of one embodiment of an electronic circuit for linearization of an amplifier in accordance with the present invention.
Figure 2:
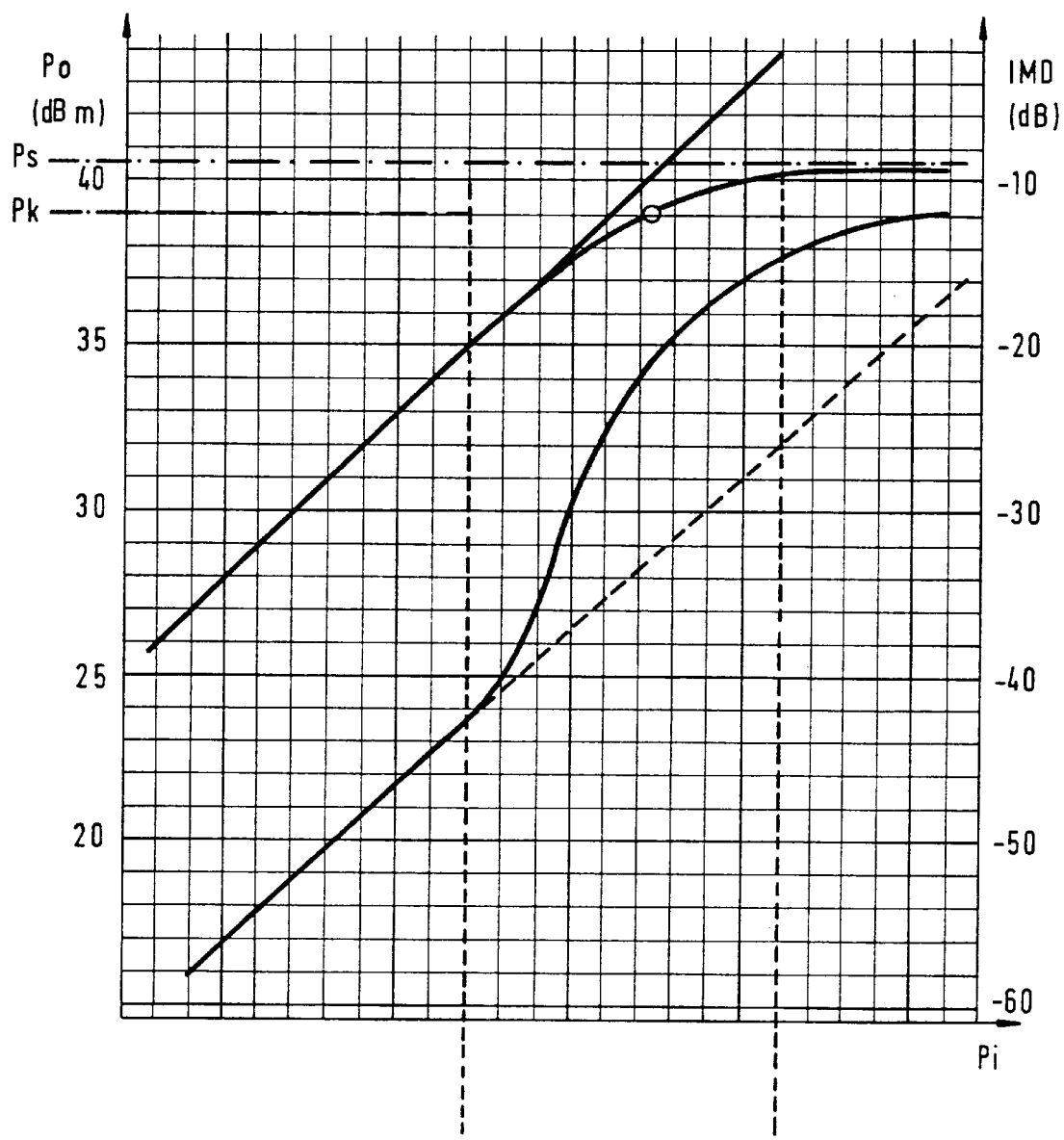
FIGS. 2 and 3 are graphical illustrations showing amplifier characteristic curves and intermodulation characteristic curves for an amplifier according to the invention.

The circuit shown in FIG. 1 includes means for linearizing the amplifier V1. A conventional characteristic curve of a semiconductor amplifier, which shows the dependence of the output power Po on the input power Pi, is shown in FIG. 2(upper characteristic curve). This type of amplifier characteristic curve has essentially three modulation regions, namely a linear, a nonlinear and a saturation region. The 1 dB-compression point Pk is characteristic for this type of amplifier characteristic curve, in which the amplification is about 1 dB smaller by compression. The saturation power Ps of the amplifier is about 1 to 1.5 dB above the 1 dB-compression point Pk. Also already in the linear modulation range, in which the output signal power Po is proportional to the input signal power Pi, the characteristic curve gently curves, which already produces intermodulation products of higher nonlinear degree or order. These intermodulation products decrease the useful information-containing signals in the spectrum and causes a certain gross bit error. In the nonlinear modulation range of the amplifier an additional curvature occurs by a gross signal modulation because of the above-mentioned compression which causes an additional reduction of the intermodulation spacing. The lower characteristic curve shown in FIG. 2, which shows the intermodulation spacing IMD, illustrates the effect that the intermodulation spacing considerably increases in the nonlinear region of the amplifier.

The circuit shown in FIG. 1 for linearization of the amplifier V1 derives an error signal f1 from the output signal a1 of the amplifier V1 and from an input signal e1. The error signal f1 is amplified by the amplifier V3 and superimposed on the output signal a1 of the amplifier V1 so that the intermodulation products present in it are compensated as much as possible. Also a signal component a12 is decoupled by a second coupler K2 from the nonlinear output signal a1 of the amplifier V1 and a signal e12 is decoupled from the input signal e1 by the first coupler K1. The input signal component e12 is fed to a fourth coupler K4 after a timing or phase compensation by means of a first timing circuit element L1. Likewise the output signal component a12 is applied to the fourth coupler K4. The output signal of the fourth coupler K4 which corresponds to the difference between the output signal component a12 and the input signal component e12 is the error signal f1. After a pre-amplifier V2 and a later-to-be-explained in more detail second attenuation element D2 and a second phase control element P2 the error signal f1 reaches the error signal amplifier V3, whose output signal f2 is subsequently superimposed on the output signal of the amplifier V1 by a sixth coupler K6. Because of that intermodulation products present in the output signal a1 of the amplifier V1 are compensated or neutralized. A linearized error-compensated output signal a2 appears at the output of the sixth coupler K6, whose intermodulation spacing is considerably larger than that of the signal a1. A third timing circuit element L3 upstream of or in front of the sixth coupler K6 acts so that the signals a1 and f2 are superimposed timed correctly so that an optimum compensation of the intermodulation products in the output signal a1 occurs.

In order to obtain an error signal f1 at the output of the fourth coupler K4, which is primarily determined by the intermodulation products in the output signal a1 of the amplifier V1 and in which the information-containing signal components are reduced as much as possible, the magnitude and phase of the input signal components e12 are adjusted by means of a first variable attenuation element D1 and a first variable phase control element P1 so that the magnitude and phase of the information-containing signal component in the input signal component e12 is equal to the information containing signal component in the output signal component a12. The useful or information-containing signal component or part then disappears because of the formation of the difference between the input signal component or part e12 and the output signal component a12 in the fourth coupler K4 and then only the intermodulation products remain in the error signal f1.

A first control unit ST1 performs the control of the first attenuation element D1 and the first phase control element P1. This first control unit ST1 keeps an error signal component f11 obtained from the error signal f1 by decoupling by means of a fifth coupler K5. The first control unit ST1 controls the first attenuation element D1 and the first phase control element P1 according to this error signal component f11 so that the information-containing signal components in the error signal f1 are as small as possible.

As can be seen from FIG. 1 a pre-distortion device or pre-harmonic generator VVZ is connected before or upstream of the amplifier V1. When the error signal f1 is very large because of higher intermodulation products at a high signal level, i.e. when the amplifier V1 is operated in a nonlinear modulation range, the first control unit ST1 adjusts the conversion function of the pre-distortion device generator VVZ so that the error signal f1 remains as small as possible. A certain amount of linearization of the amplifier output signal is already provided by the pre-distortion device, whereby the error signal f1 has a reduced level, although the amplifier itself is operated in its nonlinear region. That has the advantage that the error signal amplifier V3 need not have a large nonlinear modulation range. As already mentioned above, this type of error signal amplifier V3 can be made with a reduced circuit expense.

The first control unit ST1 controls the amplitude and the phase frequency characteristic of the pre-distortion device VVZ so that the error signal f1 is reduced as much as possible. The first control unit ST1 uses the error signal component f11 decoupled by means of the fifth coupler K5 as the control parameter for that. The first control unit ST1 retains the signal component a22 decoupled from the linearized output signal a2 by means of the seventh and eighth couplers K7 and K8. The first control unit ST1 retains by means of this signal a22 the information regarding whether the output signal level of the amplifier V1 is large and whether it finds itself thus in the nonlinear region. Only then should the pre-distortion device VVZ be activated for effective minimization of the error signal f1.

Figure 3:
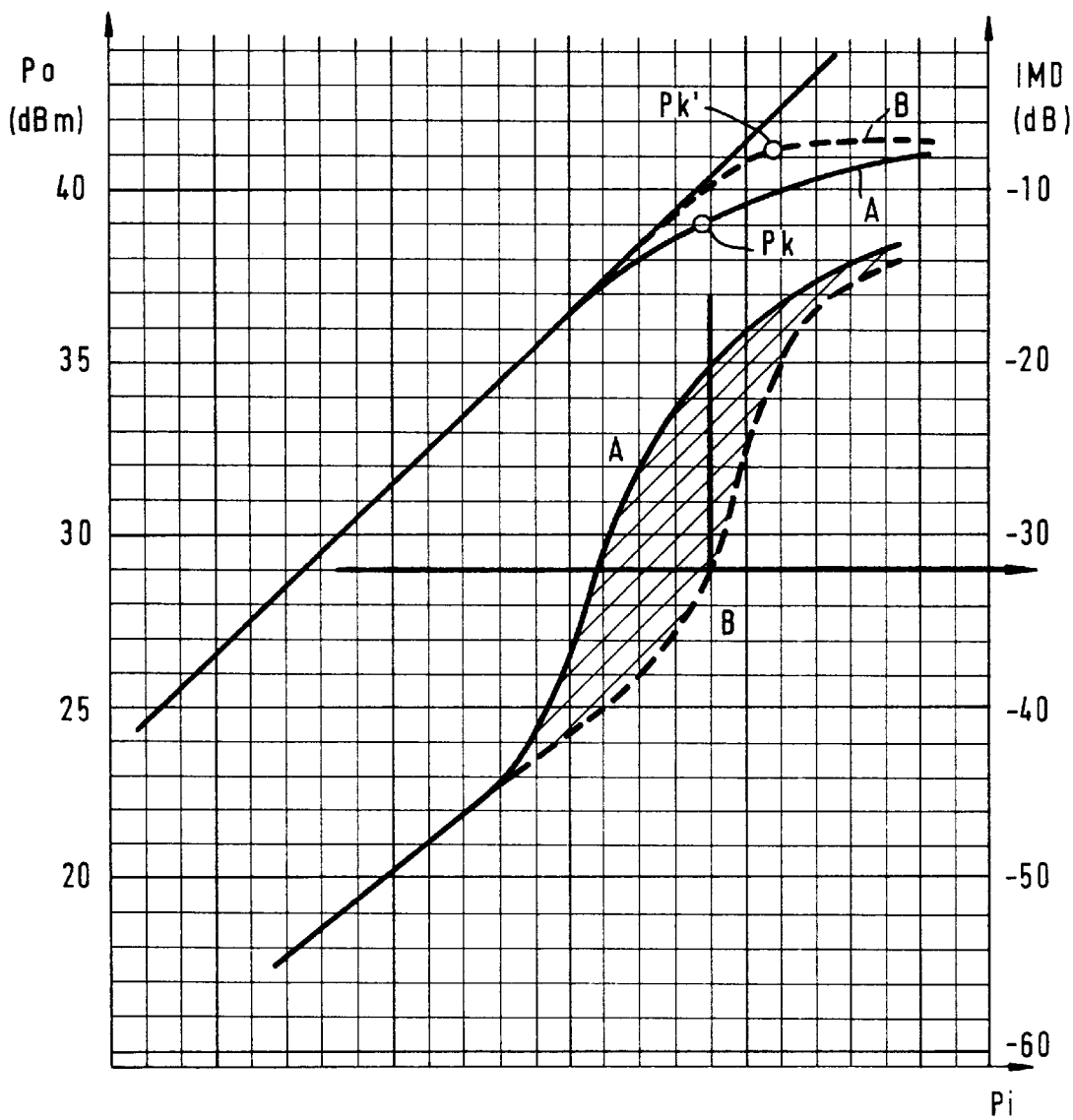

In FIG. 3 the normal characteristic curve A of the amplifier V1 with the 1 dB-compression point Pk is shown without use of the pre-distortion device VVZ. The 1 dB-compression point Pk shifts in the direction of saturation when the pre-distortion device VVZ is used, as illustrated by means of the dashed characteristic curve B. The linear region of the amplifier is thus increased because of that. The intermodulation spacing IMD increases as a comparison between the curve A without pre-distortion device VVZ and the curve B with the pre-distortion device in the lower region of FIG. 3 clearly shows.

The amount and phase of the error signal f1 are adjusted adaptively by means of a second variable attenuation element D2 and a second variable phase control element P2 so that as large as possible a compensation or neutralization of the intermodulation products in the output signal a1 of the amplifier V1 occurs at the sixth coupler K6. A second control unit ST2 controls the second attentuation element D2 and the second phase control element P2 in the stated sense. Also a control parameter for the control unit ST2 is derived from a signal component a21, which is decoupled from the linearized error-compensated output signal a2 by means of the seventh and eighth couplers K7 and K8. The difference between the output signal component a21 and an input signal component e11, which is decoupled from a third coupler K3 from the input signal e1, is formed in a subsequent ninth coupler K9, The difference signal d1 at the output of the ninth coupler K9 should contain as little as possible of the information-containing signal parts so that the difference signal d1 is determined as much as possible by the intermodulation products present in the linearized output signal a2. A second timing circuit element L2 is provided for that in the conductor carrying the input signal component e11 so that the ninth coupler superimposes both signal components e11 and a21 timed correctly. The difference signal d1 is mixed in a mixer Mx with the frequency of an oscillator LO at an intermediate frequency. The resulting signal d2 is fed subsequently to a spectrum detector SD, which is already known in the art itself and has for example already been described in Fujitsu, SCI Tech. J., Vol. 22, No. 4, September 1986, pp. 294 to 306, and the description of the spectrum detector SD therein is hereby incorporated herein by reference. The intermodulation products occur prinicipally in the side spectrum of the resulting difference signal d2 mixed in the intermediate frequency range. The second control unit ST2 now controls the second attenuation element D2 and the second phase control element P2 for the error signal f1 so that the side spectral components of the difference signal d2 are minimized. Because of that the error signal is superimposed regarding its magnitude and phase with the not linearized output signal a1 of the amplifier V1 in the sixth coupler K6 so the intermodulation products are optimally compensated in the signal.

The first difference signal d1 at the output of the ninth coupler K9 should be kept as free of useful signal components as possible so that, as already stated above, it is determined as much as possible by the intermodulation products in the output signal a1. The supression of the information-containing signal components by difference formation in the ninth coupler K9 is optimized when the input signal component e11 and the output signal component or part a21 are adjusted to each other as exactly as possible in regard to magnitude and phase. For this purpose the output signal component a21 is guided through a third variable phase shifter or control element P3 and a third variable attentuation element or member D3. The second control unit ST2 then adjusts the third variable phase shifter P3 and the third variable attenuation element D3 so that the difference signal d2 is minimized. Then based on that the influence of the information-containing signal on the difference signal d2 is essentially eliminated and it almost exclusively contains the intermodulation products.

Figure 4:
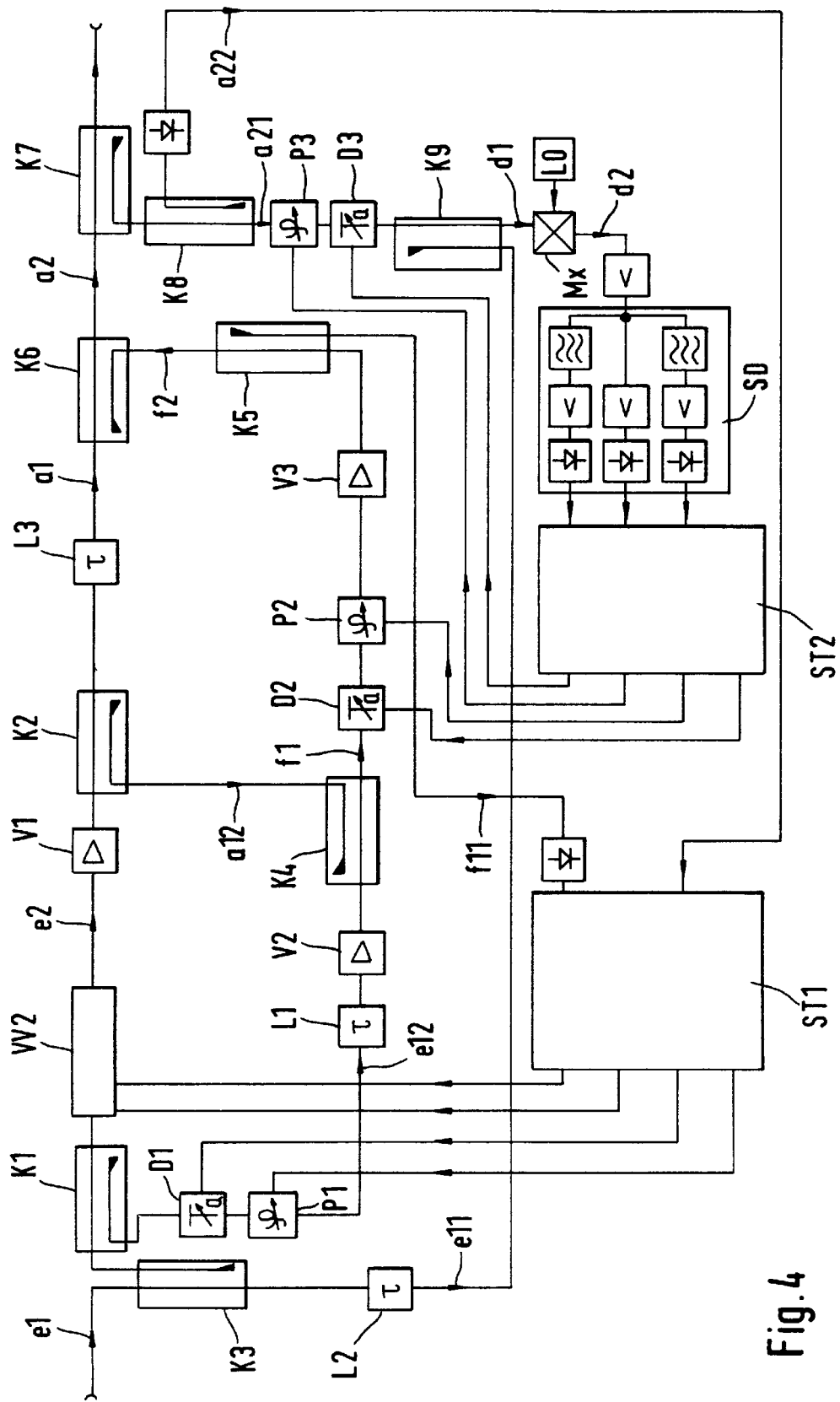
FIG. 4 is a schematic diagram of an additional embodiment of an electronic circuit for linearization of an amplifier in accordance with the present invention.

In FIG. 4 another embodiment of the circuit of the invention is shown which differs from the embodiment shown in FIG. 1 in the ways described in the following. The input signal component e12 which is derived for obtaining the error signal f1 is amplified linearly by an amplifier V2 whereby a larger level for the error signal f1 results. Furthermore this amplifier V2 can compensate for the temperature variation of the amplification of the amplifier V1. The amplification provided by the error signal amplifier V3 can be smaller because of this, whereby its delay time also is similarly reduced. As a consequence the third timing control element L3 need not provide such a large time delay, whereby its attenuation is smaller.

The error signal components f11 can be decoupled also by means of the fifth coupler K5 at the output of the error signal amplifier V3 as a control parameter for the first control unit ST1.

In the previously described embodiment two control units ST1 and ST2 are present but of course the two control units could be replaced by a single control unit in other embodiments.

The operation of the first and second control units ST1 and ST2 is described exactly in the following. The description is based on an embodiment in which a signal control unit performs the operations of the control units ST1 and ST2 in the embodiments of FIGS. 1 and 4.

In operation of the control unit difference between the measurement of the circuit during testing and in real operation must be exactly considered in operation of the control unit. In the testing situation first constant starting values are to be obtained for the pre-distortion device VVZ, for the attenuation elements D1, D2, D3 and for the phase control elements P1, P2 and P3.

To obtain the starting values the following process is required. The input signal e1 should for example by a QAM signal:

1. The amplifiers V1 and V2 are turned off.
2. The power of the input signal e1 is increased until the output signal a2 of the amplifier V1 has achieved the nominal or standard value.
3. By adjusting the third attenuation element D3 the signal component a21 decoupled from the output signal a2 of the amplifier V1 is reduced until the intermodulation products detected by the spectrum detector SD reach a minimum. Subsequently the same procedure is performed by adjusting the third phase control element P3 until the intermodulation products are minimized. The adjustment of the third attenuation element D3 and the third phase control element P3 are stored after attaining minimum intermodulation products.
4. The pre-distortion device VVZ is adjusted so that the intermodulation products detected by the spectrum detector SD are minimum. In this case the pre-distortion device VVZ has linearized the amplifier V1 so well that the nonnlinear components in the error signal f1 are minimized. The adjustment parameter for the pre-distortion device VVZ is stored.
5. The amplifier V2 is turned on. Subsequently signal component f11 decoupled from the error signal f1 is adjusted to a minimum at an input signal level e1 reduced about 10 dB with the first attenuation element D1 and the first phase control element P1. This minimum is clearly achieved by the phase-opposed addition of the signal components e12 and a12. The pre-distortion device VVZ maintains an input level lower than about 10 dB and thus makes no expansion. The present intermodulation products are substantially smaller and have no effect on the result. The adjusting parameters for the first attenuation element D1 and the first phase control element P1 are stored.
6. The power of the input signal e1 is again increased until the output signal a2 of the amplifier V1 reaches the nominal value.
7. The amplifier V3 is turned on and the side spectrum at the output of the spectrum detector SD is adjusted to be as small as possible, i.e. to a minimum, by suitable adjustment of the second attenuation element D2 and the second phase control element P2. Both the slope of the amplitude variation and the phase shift (caused by small, strongly damped resonances) can cause the side spectra to have different amplitudes.
8. All the previously determined adjusting parameters are stored in a nonvolatile memory (e.g. EPROM) so that they can be used later as starting values of a controller or central controlling means in the control unit.

In operation of the circuit according to the invention the stored starting values are adjusted by the controller of the control unit. Then a continuous adaptive optimization is performed by a program. The following process is the result of that.

1. The difference signal d1 and/or d2 is adjusted to a minimum by fine changes of the third attentuation element D3 and the third phase control element P3.

2. If the power of the signal a2 is at least 6 dB less than the nominal power, then the error signal component f11 decoupled from the error signal f1 is adjusted to a minimum by adjustment of the first attentuation element D1 and the first phase control element P1.

3. If the power of the signal a2 equals the nominal power or may be less by about 6 dB below the nominal power, then the intermodulation products at the output of the spectrum detector SD are adjusted to a minimum by cyclic changes in the second attentuation element D2 and the second phase control element P2.

4. The adjustment of the pre-distortion device VVZ is changed slightly and then an increase of the intermodulation spacing is attempted with the second attenuation element and the second phase control element. If the result of the attempt is a decrease in the intermodulation spacing, then the adjustment is reversed. By a change at the pre-distortion device VVZ when the amplifier V3 is modulated sufficiently one can measure the distortion contributions by the spectrum detector SD. Then these contributions can be reduced by an improved adjustment of the pre-distortion device VVZ.

5. Since only a reduced power of the output signal a2 is predominantly required, the first control loop can always be optimized with the first attentuation element D1 and the first phase control element P1 and the second control loop with the second attenuation element D2 and the second phase control element P2. The pre-distortion device VVZ must next be optimally adjusted if the amplifier stages of the amplifier V1 are closely dimensioned. However they then provide greater distortion contributions which are more easily measurable.

The present invention described above is also described in German Patent Application 196 50 388.4-31 of Dec. 5, 1996 whose disclosure is incorporated herein by reference. This German Patent Application provides the basis for a claim of priority for the present invention under 35 U.S.C. 119.

I claim:

1. An electronic circuit for linearization of an amplifier having an input signal and an output signal, said electronic circuit comprising means for deriving an error signal (f1) from the input signal (e1) and the output signal (a1) of the amplifier (V1), an error signal amplifier (V2) including means for amplifying the error signal, and means for superimposing said error signal (f1) on the output signal (a1) to compensate for intermodulation products contained in the output signal;

wherein said means for superimposing said error signal (f1) on the output signal (a1) comprise a pre-distortion device (VVZ) connected to said amplifier (V1), and a first control unit (ST1) including means for activating said pre-distortion device (VVZ) for minimization of the error signal (f1), when said amplifier (V1) is in a nonlinear modulation region, and means for adjusting said pre-distortion device (VVZ) according to said error signal (f1) to minimize said error signal (f1) when said pre-distortion device (VVZ) is activated.

2. The electronic circuit as defined in claim 1, wherein said means for superimposing said error signal (f1) on the output signal (a1) includes a first coupler (K1), said first coupler (K1) including means for decoupling respective signal components (e12,a12) from said input signal (e1) and said output signal (a1) of said amplifier (V1), and said means for deriving said error signal (f1) derives said error signal (f1) from a difference between said respective signal components (e12,a12).

3. The electronic circuit as defined in claim 2, wherein the first control unit (ST1) includes means for adjusting a magnitude and phase of said signal component (e12) of said input signal of said amplifier (V1) according to said difference during operation of said amplifier (V1) in a linear modulation region so that information-containing components in said error signal (f1) are reduced as much as possible.

4. The electronic circuit as defined in claim 1, wherein said means for superimposing the error signal (f1) on the output signal of the amplifier (V1) to compensate for said intermodulation products contained in said output signal (a1) includes a second control unit (ST2) for adjusting a magnitude and a phase of said error signal (f1) to form an error-compensated output signal (a2) in which said intermodulation products in said output signal (a1) are neutralized as much as possible and wherein said second control unit (ST2) adjusts said magnitude and said phase of said error signal (f1) according to a difference signal (d1) between another input signal component (e11) decoupled from said input signal (e1) of said amplifier and another output signal component (a21) decoupled from said error-compensated output signal (a2).

5. The electronic circuit as defined in claim 4, wherein said second control unit (ST2) adjusts a magnitude and a phase of said another output signal component (a21) derived from said error-compensated output signal (a2) so that an information-containing signal component in said difference signal (d1) is as small as possible.

6. The electronic circuit as defined in claim 4, further comprising a mixer (Mx) and a spectrum detector (SD) connected between said mixer (Mx) and said second control unit (ST2), and wherein said mixer (Mx) includes means for mixing said difference signal (d1) in an intermediate frequency range to form a mixer difference signal (d2) and said spectrum detector (SD) includes means for processing said mixer difference signal (d2) to select spectral components on both sides of an information-containing signal spectrum so as to form a processed mixed difference signal and means for feeding said processed mixed difference signal to said second control unit (ST2).

7. An electronic circuit for linearization of an amplifier having an input signal and an output signal, said electronic circuit comprising means for deriving an error signal (f1) from the input signal (e1) and the output signal (a1) of a main amplifier (V1), an error signal amplifier (V2) including means for amplifying the error signal (f1), and means for superimposing said error signal (f1) on the output signal (a1) to compensate for intermodulation products contained in the output signal (a2);

wherein said means for superimposing said error signal (f1) on the output signal (a1) comprise a pre-distortion device (VVZ) connected to said main amplifier (V1);

a first control unit (ST1) including means for adjusting said pre-distortion device (VVZ) according to said error signal (f1) to minimize said error signal (f1) when said main amplifier (V1) is in a nonlinear modulation region; and a first coupler (K1), said first coupler including means for decoupling respective signal components (e12, a12) from said input signal (e1) and said output signal (a1) of said main amplifier (V1);

wherein said means for deriving said error signal (f1) derives said error signal (f1) from a difference between said respective signal components (e12, a12); and wherein said first control unit (ST1) includes means for adjusting a magnitude and phase of said signal component (e12) of said input signal of said main amplifier (V1) according to said difference during operation of said main amplifier (V1) in a linear modulation region so that information-containing components are reduced as much as possible.

8. The electronic circuit as defined in claim 7, wherein said means for superimposing the error signal (f1) on the output signal of the main amplifier (V1) to compensate for said intermodulation products contained in said output signal (a1) includes a second control unit (ST2) for adjusting a magnitude and phase of said error signal (f1) to form an error-compensated output signal (a2);

means for forming a difference signal (d1) between another input signal component (e11) decoupled from said input signal (e1) of said main amplifier (V1) and another output signal component (a21) decoupled from said error-compensated output signal (a2);

a mixer (Mx) for mixing said difference signal (d1) with a frequency in an intermediate frequency range to form a mixer difference signal (d2); and a spectrum detector (SD) including means for processing said mixer difference signal (d2) to select spectral components on both sides of an information-containing signal spectrum for input to said second control unit (ST2) so as to form a processed mixed difference signal for input to said second control unit (ST2);

whereby said intermodulation products in said error-compensated output signal (a2) are neutralized as much possible.

9. The electronic circuit as defined in claim 8, wherein said second control unit (ST2) adjusts a magnitude and a phase of said another output signal component (a21) derived from said error-compensated output signal (a2) so that an information-containing signal component in said difference signal (d1) is as small as possible.

* * * * *